United States Patent
Lu et al.

(10) Patent No.: US 9,508,659 B2
(45) Date of Patent: Nov. 29, 2016

(54) METHOD AND APPARATUS TO PROTECT A WAFER EDGE

(71) Applicant: Taiwan Semiconductor Manufacturing Company, Ltd., Hsin-Chu (TW)

(72) Inventors: Chen-Fa Lu, Kaohsiung (TW); Yeur-Luen Tu, Taichung (TW); Shu-Ju Tsai, Tainan (TW); Cheng-Ta Wu, Shueishang Township (TW); Chia-Shiung Tsai, Hsin-Chu (TW); Xiaomeng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 198 days.

(21) Appl. No.: 13/932,765

(22) Filed: Jul. 1, 2013

(65) Prior Publication Data
US 2015/0001681 A1 Jan. 1, 2015

(51) Int. Cl.
H01L 21/687 (2006.01)
H01L 23/00 (2006.01)
H01L 21/304 (2006.01)
H01L 21/67 (2006.01)

(52) U.S. Cl.
CPC ........... *H01L 23/562* (2013.01); *H01L 21/304* (2013.01); *H01L 21/6715* (2013.01); *H01L 21/67092* (2013.01); *H01L 2924/0002* (2013.01)

(58) Field of Classification Search
CPC ........... H01L 23/562; H01L 21/67126; H01L 21/6715; H01L 21/68714; C08G 77/14; C08G 63/00; C08L 83/06
USPC ........... 257/618, E23.194; 118/500; 156/182
See application file for complete search history.

(56) References Cited

U.S. PATENT DOCUMENTS

| | | | |
|---|---|---|---|
| 8,753,460 B2 * | 6/2014 | Knickerbocker et al. | 156/74 |
| 2006/0205180 A1 * | 9/2006 | Henley et al. | 438/458 |
| 2009/0218560 A1 * | 9/2009 | Flaim et al. | 257/9 |
| 2010/0120975 A1 | 5/2010 | Kuroda et al. | |
| 2011/0146901 A1 * | 6/2011 | Hermanowski | 156/249 |

FOREIGN PATENT DOCUMENTS

| | | |
|---|---|---|
| JP | 2011510518 | 3/2011 |
| KR | 20090111354 | 10/2009 |
| WO | 2009094558 | 7/2009 |

* cited by examiner

*Primary Examiner* — Marcos D Pizarro
(74) *Attorney, Agent, or Firm* — Slater Matsil, LLP

(57) ABSTRACT

A method includes holding bonded wafers by a wafer holding module. A gap between the bonded wafers along an edge is filled with a protection material.

17 Claims, 4 Drawing Sheets

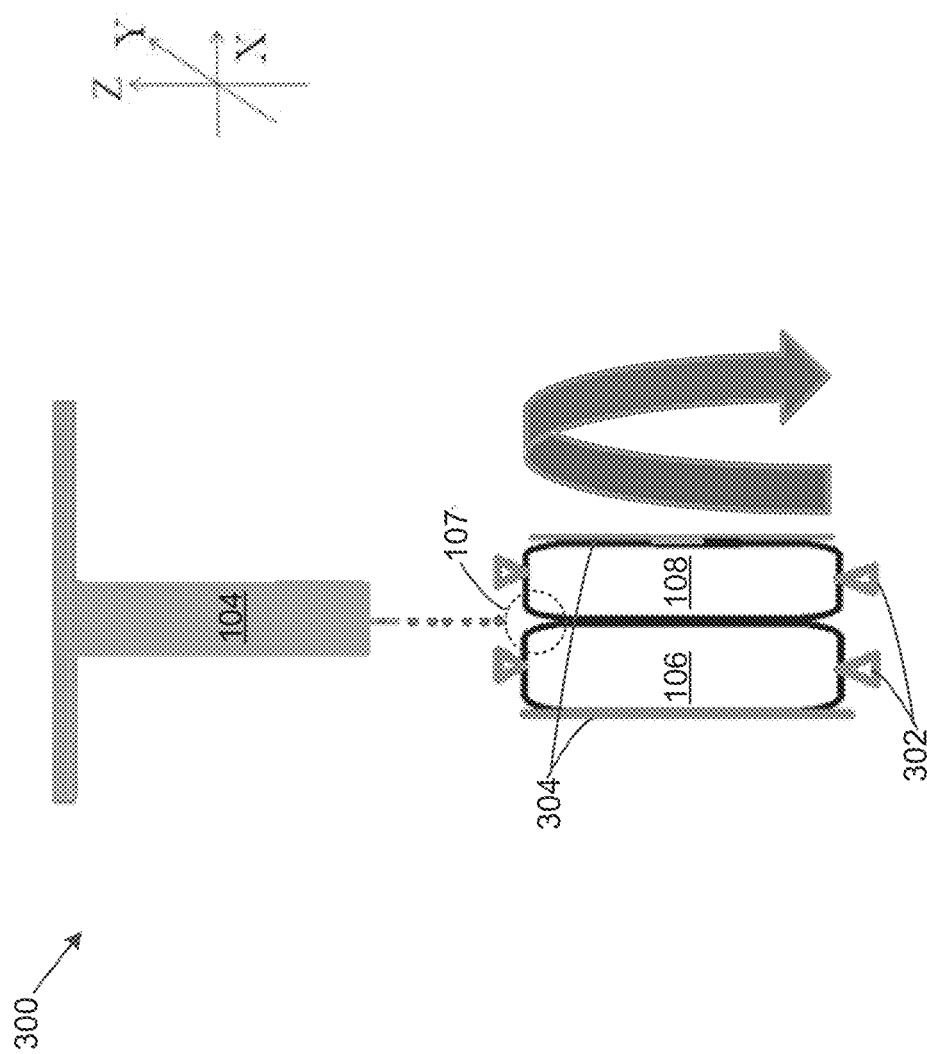

METHOD AND APPARATUS TO PROTECT A WAFER EDGE

TECHNICAL FIELD

The present disclosure relates generally to an integrated circuit and more particularly to bonded wafer edge protection scheme.

BACKGROUND

When two wafers are bonded, there can be non-bonded area close to the edge due to wafer bevels. The non-bonded area can induce cracks or peeling during direct back-grinding or other processes that apply mechanical stress.

BRIEF DESCRIPTION OF THE DRAWINGS

Reference is now made to the following descriptions taken in conjunction with the accompanying drawings, in which:

FIG. 3 is a schematic diagram of another exemplary setup for bonded wafer edge protection scheme according to some embodiments.

DETAILED DESCRIPTION

Figure 1:
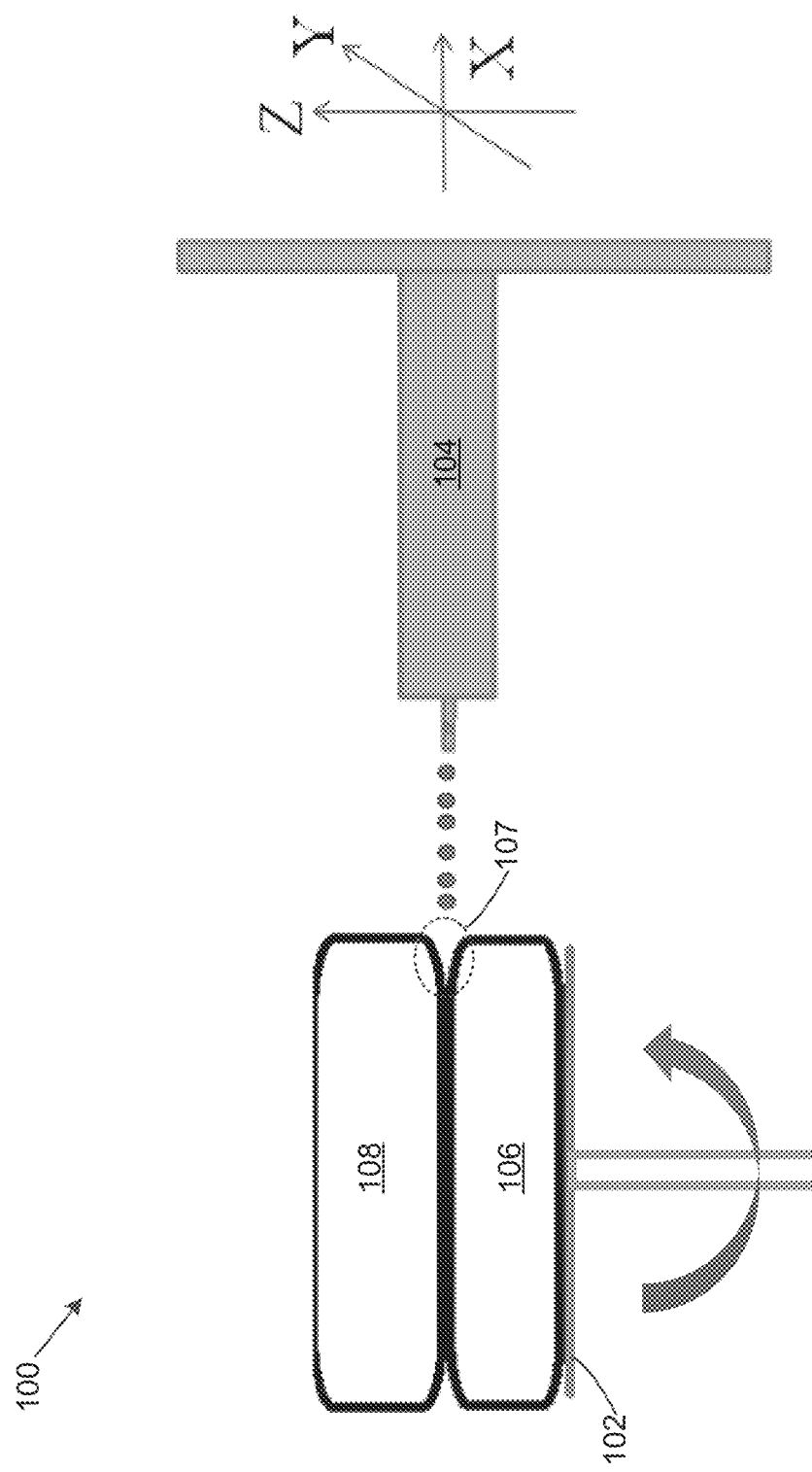
FIG. 1 is a schematic diagram of an exemplary setup for bonded wafer edge protection scheme according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary setup 100 for bonded wafer edge protection scheme according to some embodiments. The bonded wafers 106 and 108 can be bonded by using any suitable methods known in the art, such as fusion bonding, hybrid bonding, eutectic bonding, adhesive bonding, thermo-compression bonding, plasma activated bonding, or reactive bonding.

A wafer holding module 102 holds the bonded wafers 106 and 108 during application of protective material in the gap 107 between the bonded wafers 106 and 108 along an edge. For example, the wafer holding module 102 is a chuck table configured to hold the bonded wafers 106 and 108 horizontally.

In some embodiments, the wafer holding module 102 rotates the bonded wafers 106 and 108 with a stepper motor. In some embodiments, the wafer holding module 102 also provides heat to the bonded wafers 106 and 108 to help the protective material deposition to the gap 107. For example, the bonded wafers 106 and 108 can be preheated to a temperature ranging from 50° C. to 200° C.

A dispensing module 104 is configured to apply and deposit the protection material to fill the gap 107 between the bonded wafers 106 and 108 along an edge. In some embodiments, a jet nozzle spraying the protection material is used for the dispensing module 104. In one example, a fluid pressure of 10 psi and jet valve pressure of 90 psi is used with a jet on/off time of 4 ms/3 ms. The jet valve is pre-heated to 55° C. and the protection/fill material is heated prior to being dispensed. The wafer is rotated at a speed of 3 degree/sec.

The dispensing module 104 has a position adjustment with 3 axis (X-Y-Z) movements in some embodiments. The gap 107 has a width up to 4 mm from the edge of the bonded wafers 106 and 108 in some embodiments as described below.

The protection material comprises epoxy or underfill material in some embodiments. For example, the protection material comprises carbon, silicon, and oxygen in some embodiments. In some other embodiments, the protection material comprises carbon, alumina, and oxygen. In some embodiments, commercially available underfill materials such as ShinEtsu 375-TGSF5 or Namics U8410-84 can be used.

Figure 2B:
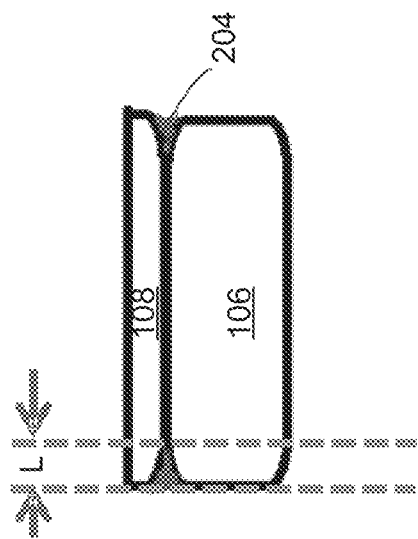
FIG. 2B is a cross section view of the exemplary wafers in FIG. 1.
Figure 2A:
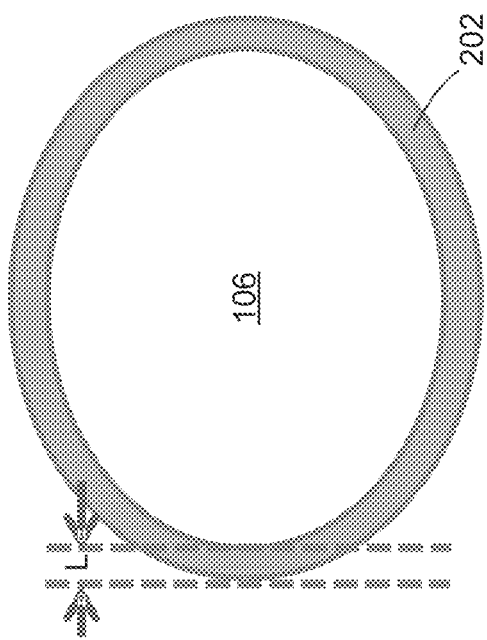
FIG. 2A is a top view of an exemplary wafer that is shown in FIG. 1.

FIG. 2A is a top view of an exemplary wafer 106 that is shown in FIG. 1. The width L is the distance of the gap 202 (i.e., 107 in FIG. 1) from the edge of the wafer 106. The width L is up to 4 mm from the edge of the bonded wafers 106 and 108 in some embodiments. When the top wafer 108 in FIG. 1 is bonded to the bottom wafer 106, there is a space between the two wafers 106 and 108 along the edge 202 due to edge bevels of the wafers 106 and 108 that creates the gap 107 in FIG. 1.

FIG. 2B is a cross section view of the exemplary wafers in FIG. 1. The protection material filled in the gap 107 in FIG. 1 forms a (bevel) edge seal 204 between the wafers 106 and 108 along the edge. The width L is the width of the gap 202 in FIG. 2A (i.e., 107 in FIG. 1) from the edge of the wafers 106 and 108. The width L is up to 4 mm from the edge of the bonded wafers 106 and 108 in some embodiments.

FIG. 3 is a schematic diagram of another exemplary setup 300 for bonded wafer edge protection scheme according to some embodiments. The wafer holding module in FIG. 3 includes a roller portion 302 and vertical support plates 304 that hold the bonded wafers 106 and 108 vertically. The roller portion 302 rotates the bonded wafers 106 and 108 with a stepper motor and the vertical support plates provide stability in some embodiments. Any other suitable mechanism can be used for the wafer holding module, such as a vertical chuck to hold and rotate the wafers 106 and 108.

In some embodiments, the vertical support plates 304 (a part the wafer holding module in FIG. 3) also provide heat to the bonded wafers 106 and 108 to help the protective material deposition to the gap 107. For example, the bonded wafers 106 and 108 can be preheated to a temperature ranging from 50° C. to 200° C. before dispensing the protective material in the gap 107.

The dispensing module 104 is similar to the setup 100 in FIG. 1 except that the dispensing module 104 is arranged to dispense the protection material vertically to fill the gap 107 between the wafers 106 and 108. In some embodiments, a jet nozzle spraying the protection material is used for the dispensing module 104.

In one example, a fluid pressure of 10 psi and jet valve pressure of 90 psi is used with a jet on/off time of 4 ms/3 ms. The jet valve is pre-heated to 55° C. and the protection/fill material is heated prior to being dispensed. The wafer is rotated at a speed of 3 degree/sec. The dispensing module 104 has a position adjustment with 3 axis (X-Y-Z) movements in some embodiments.

Figure 4:
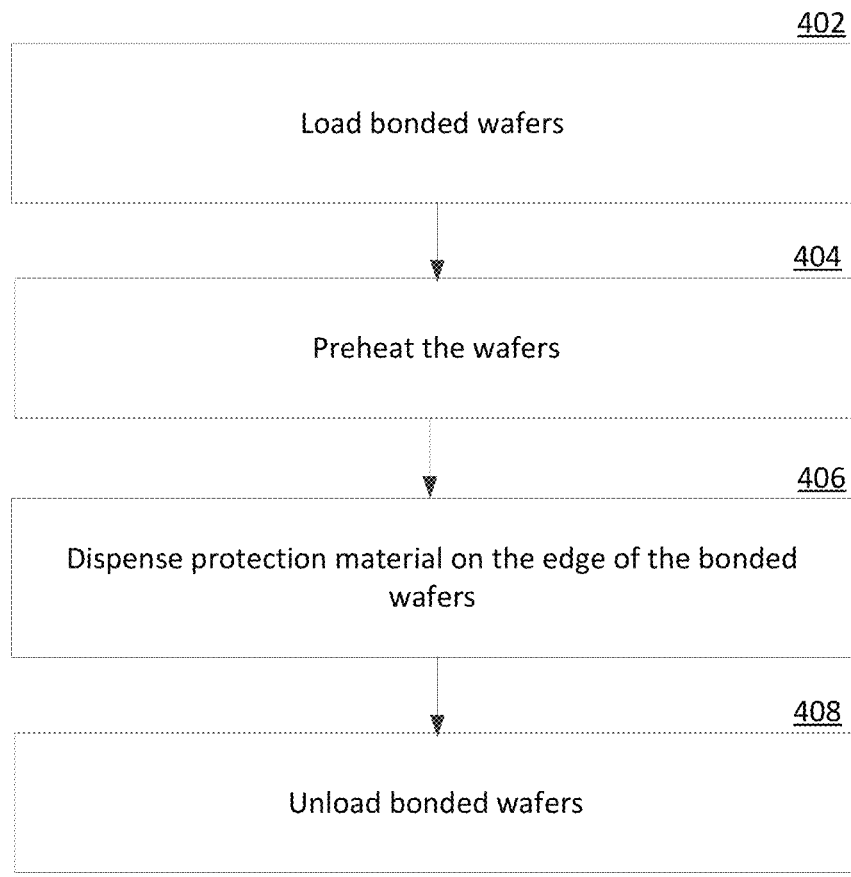
FIG. 4 is a flowchart of an exemplary method for bonded wafer edge protection scheme according to some embodiments.

FIG. 4 is a flowchart of an exemplary method for bonded wafer edge protection scheme according to some embodiments. At step 402, bonded wafers 106 and 108 are loaded to a wafer holding module 102 to hold the bonded wafers 106 and 108. In some embodiments, the wafer holding module 102 can be a chuck table.

At step 404, the bonded wafers 106 and 108 are preheated to help the protective material deposition in the gap 107. For example, the bonded wafers 106 and 108 can be preheated to a temperature ranging from 50° C. to 200° C. before dispensing the protective material in the gap 107. In some embodiments, the wafer holding module 102 can include a heating mechanism such as an electrical resistive element to provide the heating function.

At step 406, the protective material is dispensed by a dispensing module 104 in the gap 107 on the edge of the bonded wafers 106 and 108. In some embodiments, the dispensing module 104 can be a jet nozzle spraying the protection material. In some embodiments, the bonded wafers 106 and 108 are rotated by the wafer holding module 102.

The protection material filled in the gap 107 forms a bevel seal 204 in FIG. 2B between the wafers 106 and 108 along the edge. The width of the gap 107 from the edge of the bonded wafers 106 and 108 is up to 4 mm in some embodiments. The protection material comprises epoxy or underfill material in some embodiments. For example, the protection material comprises carbon, silicon, and oxygen in some embodiments. In some other embodiments, the protection material comprises carbon, alumina, and oxygen.

At step 408, the bonded wafers 106 and 108 are unloaded from the wafer holding module 102 after the gap 107 is filled. In some embodiments, a thermal process is performed for the post curing of the protective material in the gap 107 of the bonded wafers 106 and 108. For example, the bonded wafers 106 and 108 can be treated in a chamber with a temperature of 165° C. for 2 hours in some embodiments.

The method in FIG. 4 to seal the gap 107 between bonded wafers 106 and 108 (due to the wafer bevel) is performed to enhance the bonding strength of the wafers 106 and 108 to avoid any mechanical damage during other processes such as grinding. For example, after the process as described above, the backside wafer such as 108 can be thinned down to less than 100 μm thickness or go through other processes without cracking or peeling of the wafers 106 and 108 due to the strengthened bonding of the wafers 106 and 108.

According to some embodiments, a method includes holding bonded wafers by a wafer holding module. A gap between the bonded wafers along an edge is filled with a protection material.

According to some embodiments, a wafer assembly includes two wafers bonded together and an edge seal. The edge seal comprises a protective material filled in a gap between the two wafers along an edge.

According to some embodiments, an apparatus includes a wafer holding module and a dispensing module. The wafer holding module is configured to hold bonded wafers. The dispensing module is configured to apply a protection material to fill a gap between the bonded wafers along an edge.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method comprising:
receiving within a wafer holding module a bonded first and second wafer, the bonded first and second wafer having a gap therebetween;
preheating the bonded first and second wafer;
positioning a dispensing module to be adjacent the gap;
rotating the bonded first and second wafer and the dispensing module relative one another;
dispensing a protective material from the dispensing module into the gap during the rotating step to fill the gap; and
performing a thermal process on the bonded first and second wafer after the gap is filled.

2. The method of claim 1, wherein the step of rotating the bonded first and second wafer relative one another comprises rotating the bonded first and second wafer.

3. The method of claim 1, further comprising pre-heating a nozzle of the dispensing module prior to dispensing the protective material.

4. A method comprising:
bonding a first wafer to a second wafer using a bonding process selected from the group consisting of fusion bonding, hybrid bonding, eutectic bonding, plasma activated bonding, and reactive bonding;
heating the bonded first wafer and second wafer before dispensing the protective material; and after bonding the first wafer to a second wafer, dispensing a protective material to an edge gap between the first and the second wafer.

5. The method of claim 4, further comprising:
placing the bonded first and second wafer into a wafer holding module before dispensing the protective material.

6. The method of claim 4, further comprising rotating the bonded first and second wafer while dispensing the protective material.

7. The method of claim 4, wherein the dispensed protective material forms an edge seal sealing the gap.

8. The method of claim 4, wherein the step of dispensing a protective material to an edge gap between the first and the second wafer includes dispensing protective material from a nozzle directed at the gap.

9. The method of claim 8, wherein the protective material is dispensed at a fluid pressure of 10 psi and a valve pressure of 90 psi with a jet on/off time of 4 ms/3 ms.

10. A method, comprising:
holding bonded wafers by a wafer holding module;
after bonding the bonded wafers, preheating the bonded wafers; and
filling a gap between the bonded wafers along an edge with a protection material.

11. The method of claim 10, wherein the bonded wafers are heated to a temperature ranging from 50° C. to 200° C.

12. The method of claim 10, wherein the bonded wafers are heated by the wafer holding module.

13. The method of claim 10, further comprising rotating the bonded wafers by the wafer holding module.

14. The method of claim 10, wherein the gap is filled by spraying the protection material by a jet nozzle.

15. The method of claim 10, wherein the protection material comprises epoxy or underfill material.

16. The method of claim 10, wherein the protection material comprises carbon, silicon, and oxygen.

17. The method of claim 10, wherein the protection material comprises carbon, alumina, and oxygen.

* * * * *